(12) United States Patent
Chu et al.

(10) Patent No.: US 6,222,411 B1
(45) Date of Patent: Apr. 24, 2001

(54) INTEGRATED CIRCUIT DEVICES HAVING SYNCHRONIZED SIGNAL GENERATORS THEREIN

(75) Inventors: Yong-gyu Chu; Jung-bae Lee, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/318,206

(22) Filed: May 25, 1999

(30) Foreign Application Priority Data

Jul. 13, 1998 (KR) .................................................. 98-28165

(51) Int. Cl.7 ............................................................ H03K 5/13
(52) U.S. Cl. ................................................ 327/295; 327/258
(58) Field of Search ................................. 327/52, 65, 68, 327/69, 63, 231, 238, 70, 239, 257, 258, 259, 291, 293, 294, 285

(56) References Cited

U.S. PATENT DOCUMENTS

| | | | |
|---|---|---|---|
| 5,751,186 | * | 5/1998 | Nakao ................................. 327/562 |
| 5,757,711 | * | 5/1998 | Nakaoka et al. ....................... 327/52 |
| 5,764,175 | * | 6/1998 | Pan ....................................... 327/52 |
| 5,801,554 | * | 9/1998 | Momma et al. ....................... 327/89 |
| 5,821,809 | * | 10/1998 | Boerstler ............................. 327/563 |
| 5,864,587 | * | 1/1999 | Hunt ..................................... 327/52 |

FOREIGN PATENT DOCUMENTS 0 809 359 A1    11/1997 (EP).

* cited by examiner

Primary Examiner—Toan Tran
Assistant Examiner—Linh Nguyen
(74) Attorney, Agent, or Firm—Myers Bigel Sibley & Sajovec

(57) ABSTRACT

Integrated circuit devices having synchronized signal generators therein include a first signal generator and a second signal generator. The first signal generator receives a first input signal and a complementary version of the first input signal at true and complementary inputs thereto, respectively, and generates a first output signal having a leading edge in-sync with a leading edge of the first input signal (e.g., clock signal CLK) but delayed relative thereto by a first time interval. The second signal generator receives the first input signal and the complementary version of the first input signal at complementary and true inputs thereto, respectively, and generates a second output signal having a leading edge in-sync with a leading edge of the complementary version of the first input signal but delayed relative thereto by the first time interval. First and second pulse generators are also preferably provided. The first pulse generator is responsive to the first output signal and the second pulse generator is responsive to the second output signal.

12 Claims, 3 Drawing Sheets

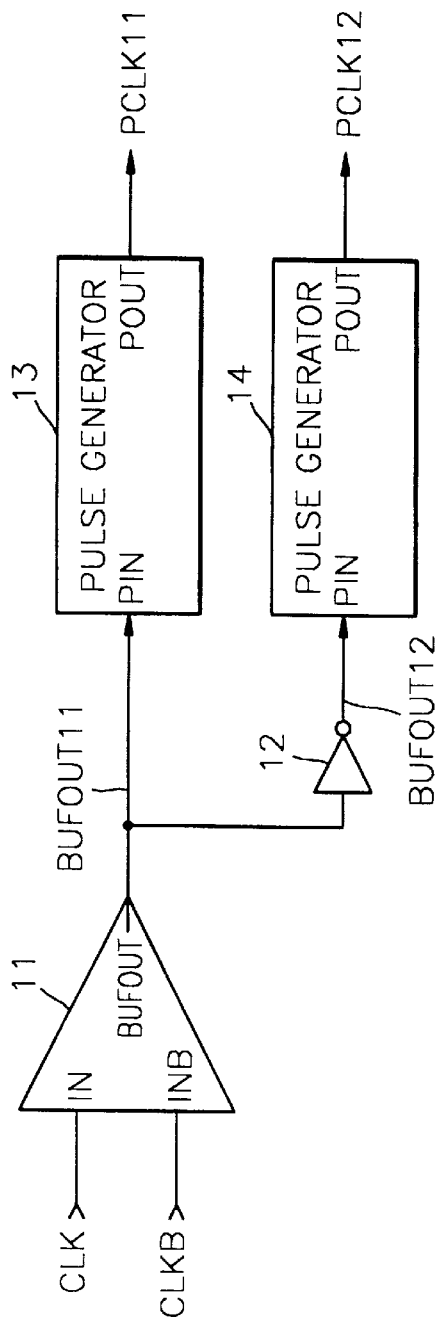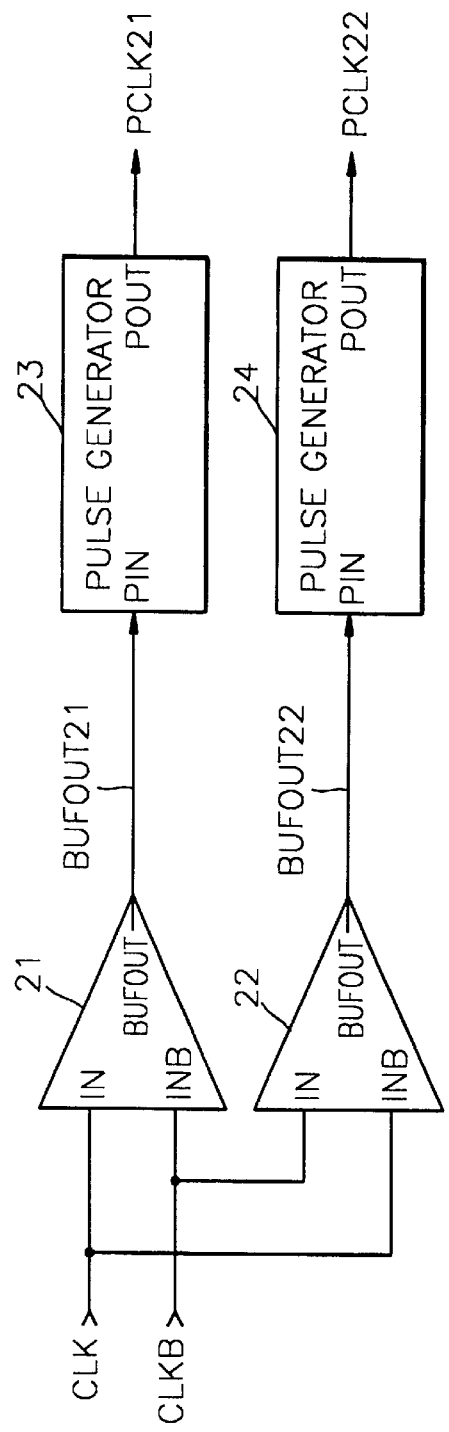

US 6,222,411 B1

INTEGRATED CIRCUIT DEVICES HAVING SYNCHRONIZED SIGNAL GENERATORS THEREIN

RELATED APPLICATION

This application is related to Korean Application No. 98-28165, filed Jul. 13, 1998, the disclosure of which is hereby incorporated herein by reference.

FIELD OF THE INVENTION

The present invention relates to integrated circuit devices, and more particularly to integrated circuit devices which provide synchronous signal operation.

BACKGROUND OF THE INVENTION

Integrated circuit devices, such as synchronous dynamic random access memory devices (SDRAMs), utilize synchronous operation to improve device performance. For example, double data rate (DDR) SDRAMs utilize leading and trailing edges of clock signals to facilitate higher data rate operation. When SDRAMs are operated in the DDR mode, important reference signals are typically generated in-sync with rising and falling edges of a clock signal, to efficiently control operation of such devices as input and output buffers. Unfortunately, conventional attempts to detect rising and falling edges of a clock signal or other control signals may be susceptible to errors if changes in device fabrication techniques, processing conditions or signal noise are significant.

Thus, notwithstanding attempts to provide integrated circuits that operate in a synchronous manner, there continues to be a need for integrated circuits having improved synchronization characteristics.

SUMMARY OF THE INVENTION

It is therefore an object of the present invention to provide integrated circuit devices and signal generators that have improved synchronization characteristics.

These and other objects, advantages and features of the present invention are provided by integrated circuit devices that are capable of generating reference signals having improved synchronization characteristics. According to a preferred embodiment of the present invention, an integrated circuit device comprises a first signal generator and a second signal generator. The first signal generator receives a first input signal and a complementary version of the first input signal at true and complementary inputs thereto, respectively, and generates a first output signal having a leading edge in-sync with a leading edge of the first input signal (e.g., clock signal CLK) but delayed relative thereto by a first time interval. The second signal generator receives the first input signal and the complementary version of the first input signal at complementary and true inputs thereto, respectively, and generates a second output signal having a leading edge in-sync with a leading edge of the complementary version of the first input signal but also delayed relative thereto by the first time interval.

According to a preferred aspect of the present invention, the first and second signal generators may comprise first and second differential amplifiers, respectively. First and second pulse generators are also preferably provided. The first pulse generator is responsive to the first output signal and the second pulse generator is responsive to the second output signal. Preferably, the first pulse generator comprises a first PMOS transistor electrically connected in series between a first reference potential (e.g., Vcc) and an intermediate output node and a pair of NMOS transistors electrically connected in series between the intermediate output node and a second reference potential (e.g., Vss). The first pulse generator also preferably comprises a feedback delay circuit having an input electrically connected to the intermediate output node and an output electrically connected to a gate electrode of the first PMOS transistor. According to another preferred aspect of the first pulse generator, a first one of the pair of NMOS transistors has a gate electrode electrically connected to an output of the first signal generator and a second one of the pair of NMOS transistors has a gate electrode electrically connected to the output of the feedback delay circuit. The first pulse generator may also comprise a second PMOS transistor electrically connected in series between the first reference potential and the intermediate output node and an inverter having an input electrically connected to the intermediate output node and an output electrically connected to a gate electrode of the second PMOS transistor. The second pulse generator is constructed similarly.

BRIEF DESCRIPTION OF THE DRAWINGS

FIG. 1 is a block diagram of an integrated circuit device according to a first embodiment of the present invention.

FIG. 2 is a block diagram of an integrated circuit device according to a second embodiment of the present invention.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 5:
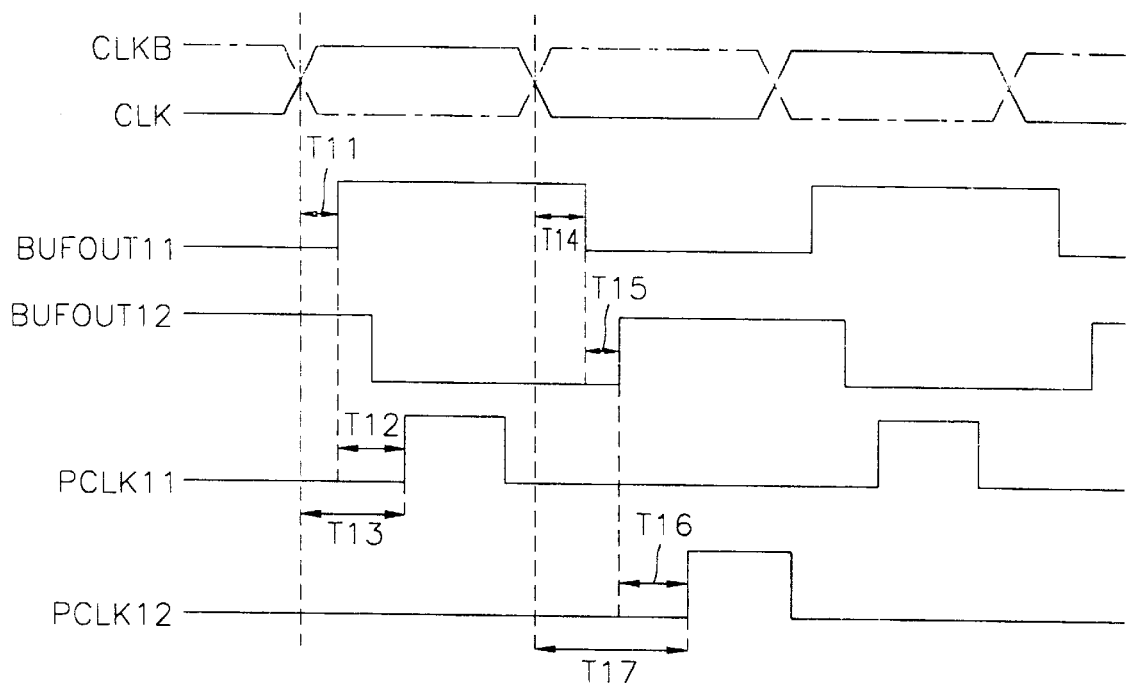
FIG. 5 is a timing diagram that illustrates operation of the device of FIG. 1.
Figure 6:
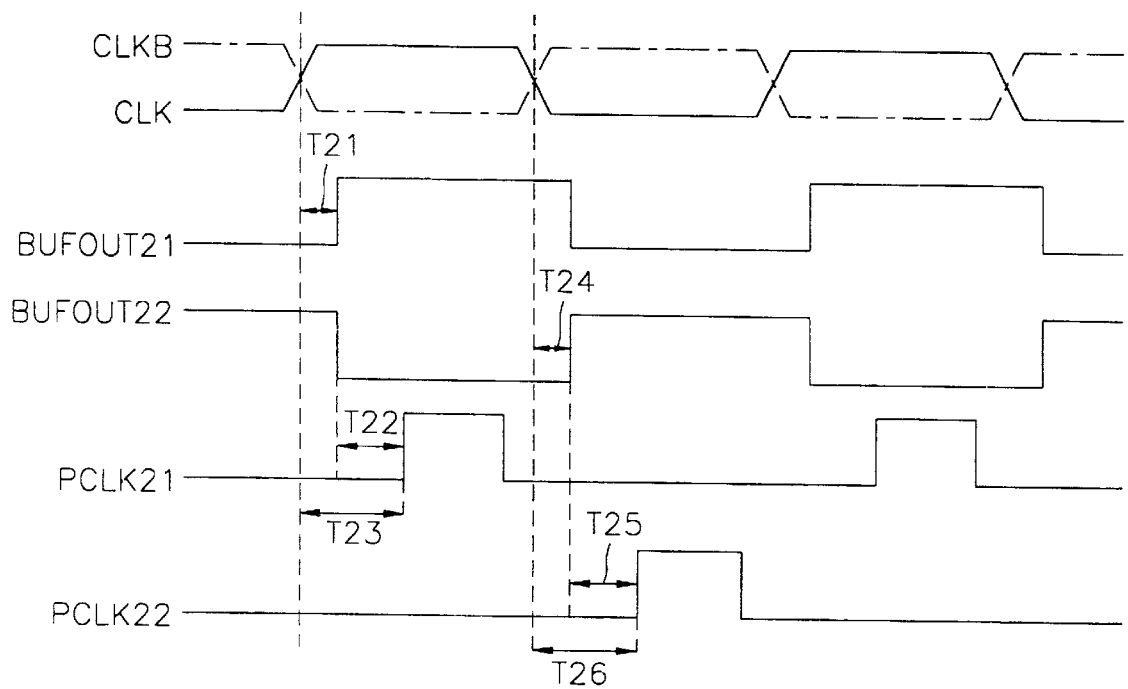
FIG. 6 is a timing diagram that illustrates operation of the device of FIG. 2.

Referring now to FIG. 1, an integrated circuit device according to a first embodiment of the present invention includes a sensing circuit 11 having true and complementary inputs IN and INB, respectively, that receive a clock signal CLK and an inverted version of the clock signal CLKB (see, e.g., FIGS. 5–6). The sensing circuit generates an output signal BUFOUT11. This output signal is provided directly to a pulse generator 13 and to an inverter 12. An output signal BUFOUT12 is generated by the inverter 12 and provided to a pulse generator 14. These pulse generators 13 and 14 generate signals PCLK11 and PCLK12, as illustrated.

Figure 3:
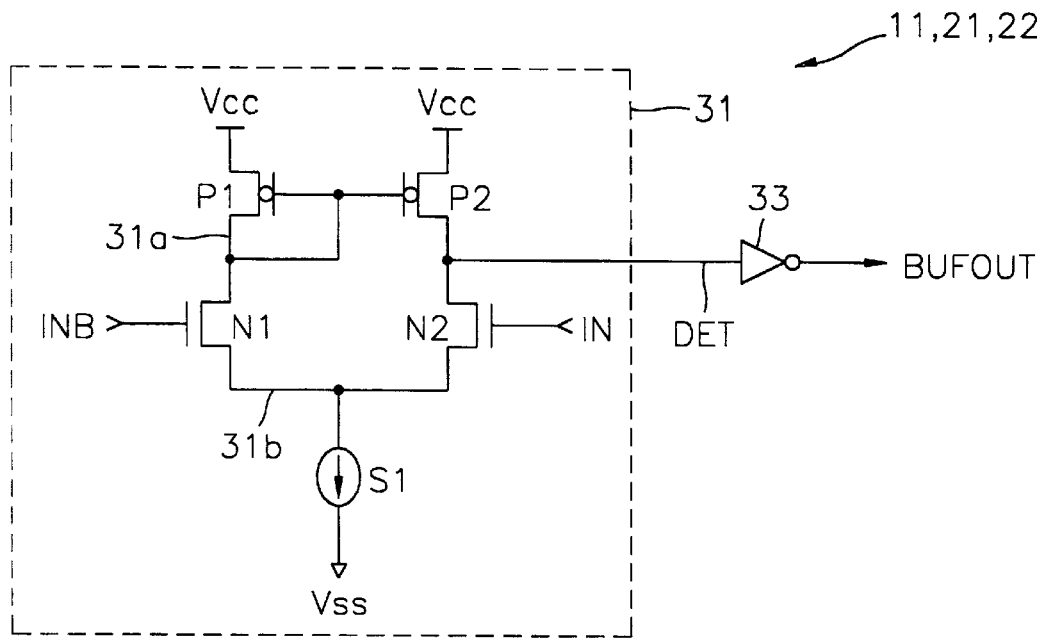
FIG. 3 is an electrical schematic of a differential amplifier that may be utilized in the devices of FIGS. 1–2.

Referring now to FIG. 3, a preferred sensing circuit 11 is illustrated. The illustrated sensing circuit 11 comprises a differential amplifier 31 and an inverter 33 having an input that is electrically connected to an output DET of the differential amplifier 31. The differential amplifier 31 comprises a current source S1 connected between signal line 31b and a ground or negative reference potential Vss. NMOS transistors N1 and N2 are also provided along with PMOS transistors P1 and P2. As will be understood by those skilled in the art, the NMOS transistors N1 and N2 preferably have similar characteristics and the PMOS transistors P1 and P2 preferably have similar characteristics. The differential amplifier 31 operates by amplifying a difference in potential between the true input IN and the complementary input INB. In particular, when a potential of the true input IN is greater than a potential of the complementary input INB, the difference in potential will be amplified and the output DET will be driven to a logic 0 level and the output BUFOUT of inverter 33 will be driven to a logic 1 level. Alternatively, when a potential of the complementary input INB is greater than a potential of the true input IN, the output DET will be driven to a logic 1 level and the output BUFOUT of inverter 33 will be driven to a logic 0 potential.

Referring now to FIGS. 1 and 5, the output BUFOUT11 of the sense circuit 11 is provided directly to a pulse generator 13 and to an inverter 12, but because of the delay associated with the differential amplifier 31 and inverter 33, a rising edge of the output BUFOUT11 will be delayed by an amount T11 relative to a rising edge of the clock signal CLK and a failing edge of the output BUFOUT11 will be delayed by an amount T14 relative to a falling edge of the clock signal CLK. The output BUFOUT12 of the inverter 12 also represents an inverted and delayed version of the output BUFOUT11, where the additional inverter delay is represented by time interval T15.

Figure 4:
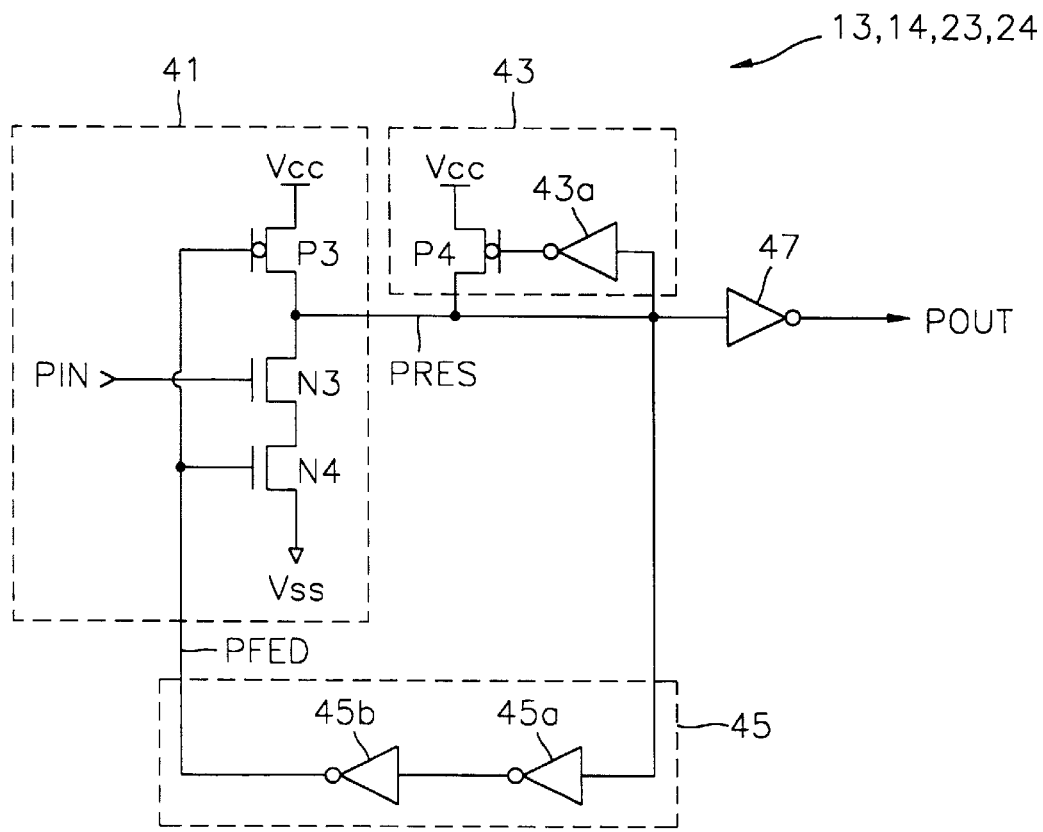
FIG. 4 is a pulse generator that may be utilized in the devices of FIGS. 1–2.

Referring now to FIG. 4, a preferred pulse generator is illustrated. This pulse generator comprises a pair of NMOS transistors N3 and N4 that are electrically connected in series between an intermediate output node PRES and a ground or negative reference potential Vss. A PMOS pull-up transistor P3 is also provided. These transistors comprise a response portion 41. The PMOS pull-up transistor P3 is electrically connected in series between the intermediate output node PRES and a power supply potential Vcc. The gate electrodes of the PMOS transistor P3 and the NMOS transistor N4 are electrically connected together and to the output PFED of a feedback delay circuit 45. This feedback delay circuit comprises a pair of inverters 45a and 45b which provide a predetermined delay to signals at the intermediate output node PRES. The intermediate output node PRES is also provided as an input to an inverter 43a. The output of the inverter 43a is provided to a gate electrode of a PMOS pull-up transistor P4. The inverter 43a and PMOS transistor P4 collectively form a latch 43. The output inverter 47 generates an output signal POUT.

Operation of the pulse generator of FIG. 4 will now be described. In particular, when the input signal PIN is at a logic 0 level, the intermediate output node PRES will be held at a logic 1 level. The intermediate output node PRES will not be allowed to remain at a logic 0 level because such a logic 0 level will be passed by the feedback delay circuit 45 to the PMOS pull-up transistor P3 which will act to pull-up node PRES. Moreover, as soon as node PRES reaches a minimum logic 1 level, the output of inverter 43a will transition to a logic 0 level and turn on PMOS pull-up transistor P4. Thus, during quiescent operation, the intermediate output node PRES will be held at a logic 1 level and NMOS pull-down transistor N4 will be turned on. Then, if the input signal PIN is driven to a logic 1 level, NMOS transistor N3 will turn on and pull the intermediate output node PRES to a logic 0 level (since NMOS transistor N4 is on as well). This logic 0 level will be transferred as a logic 1 signal at an output of the inverter 47 (i.e., POUT will transition from 0→1). In addition, after a predetermined time interval established by the delays associated with inverters 45a and 45b in the feedback delay circuit 45, the logic 0 level at the intermediate output node PRES will be transferred to node PFED. This will act to turn off NMOS transistor N4 and turn on PMOS transistor P3 and thereby pull the intermediate output node PRES back to a logic 1 level. The output POUT of the inverter 47 will then transition back to a logic 0 level.

Accordingly, the signal PCLK11 at the output of pulse generator 13 will be provided as a pulse, as illustrated by FIG. 5, and a rising edge of this pulse will be delayed relative to a rising edge of signal BUFOUT11 by a time interval of T12 (and delayed relative to a rising edge of the clock signal CLK by a time interval T13). Similarly, the signal PCLK12 at the output of pulse generator 14 will be provided as pulse and a rising edge of this pulse will be delayed relative to a rising edge of signal BUFOUT12 by a time interval of T16 (and delayed relative to a falling edge of the clock signal CLK by a time interval T17=T14+T15+T16). Unfortunately, because the duration of the time interval T17 is greater than the duration of the time interval T13 (by an amount equal to the delay associated with inverter 12), a timing skew is present between the synchronization of the pulse signal PCLK11 relative to a rising edge of the clock signal CLK and the synchronization of the pulse signal PCLK12 relative to a falling edge of the clock signal CLK. Such a timing skew can cause malfunction of integrated circuits which require improved synchronization.

To address this limitation associated with the device of FIG. 1, a more preferred embodiment of the present invention is provided. This embodiment is illustrated by FIG. 2. The device of FIG. 2 is similar to the device of FIG. 1, however, two sensing circuits 21 and 22 are used instead of the single sensing circuit 11 and inverter 12 illustrated by FIG. 1. These two sensing circuits 21 and 22 have matching characteristics. Based on this more preferred configuration, the synchronization of signal BUFOUT21 to a rising edge of the clock signal CLK can be matched with the synchronization of signal BUFOUT22 to a falling edge of the clock signal CLK (i.e., T21=T24), as illustrated by FIG. 6. Likewise, the synchronization of the pulse PCLK21 to a rising edge of the clock signal CLK can be matched with the synchronization of pulse PCLK22 to a falling edge of the clock signal CLK (i.e., (T21+T22)=T23=T26=(T24+T25)).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a first signal generator that receives a first input signal and a complementary version of the first input signal at true and complementary inputs thereto, respectively, and generates a first output signal having a first duty cycle and a leading edge in-sync with a leading edge of the first input signal but delayed relative thereto;
   a second signal generator that receives the first input signal and the complementary version of the first input signal at complementary and true inputs thereto, respectively, and generates a second output signal having a second duty cycle and a leading edge in-sync with a leading edge of the complementary version of the first input signal but delayed relative thereto;

a first pulse generator that is responsive to the first output signal and generates at an output thereof a signal that is in-sync with the first output signal but has a duty cycle that is less than the first duty cycle; and a second pulse generator that is responsive to the second output signal and generates at an output thereof a signal that is in-sync with the second output signal but has a duty cycle that is less than the second duty cycle.

2. The device of claim 1, wherein said first and second signal generators comprise first and second differential amplifiers, respectively.

3. An integrated circuit device, comprising:

a first signal generator that receives a first input signal and a complementary version of the first input signal at true and complementary inputs thereto, respectively, and generates a first output signal having a leading edge in-sync with a leading edge of the first input signal but delayed relative thereto by a first time interval;

a second signal generator that receives the first input signal and the complementary version of the first input signal at complementary and true inputs thereto, respectively, and generates a second output signal having a leading edge in-sync with a leading edge of the complementary version of the first input signal but delayed relative thereto by the first time interval;

a first pulse generator responsive to the first output signal; and a second pulse generator responsive to the second output signal;

wherein said first pulse generator comprises:

a first PMOS transistor electrically connected in series between a first reference potential and an intermediate output node;

a pair of NMOS transistors electrically connected in series between the intermediate output node and a second reference potential; and a feedback delay circuit having an input electrically connected to the intermediate output node and an output electrically connected to a gate electrode of the first PMOS transistor.

4. The device of claim 3, wherein a first of said pair of NMOS transistors has a gate electrode electrically connected to an output of said first signal generator; and wherein a second of said pair of NMOS transistors has a gate electrode electrically connected to the output of said feedback delay circuit.

5. The device of claim 4, further comprising:

a second PMOS transistor electrically connected in series between the first reference potential and the intermediate output node; and an inverter having an input electrically connected to the intermediate output node and an output electrically connected to a gate electrode of said second PMOS transistor.

6. The device of claim 3, wherein said first and second signal generators comprise first and second differential amplifiers, respectively.

7. The device of claim 6, wherein a first of said pair of NMOS transistors has a gate electrode electrically connected to an output of said first signal generator; and wherein a second of said pair of NMOS transistors has a gate electrode electrically connected to the output of said feedback delay circuit.

8. The device of claim 7, further comprising:

a second PMOS transistor electrically connected in series between the first reference potential and the intermediate output node; and an inverter having an input electrically connected to the intermediate output node and an output electrically connected to a gate electrode of said second PMOS transistor.

9. An integrated circuit device, comprising:

a first differential amplifier having a true input and a complementary input that receive a clock signal and an inverted version of the clock signal, respectively;

a second differential amplifier having a true input and a complementary input that receive the inverted version of the clock signal and the clock signal, respectively;

a first pulse generator that has an input electrically connected to an output of said first differential amplifier and generates a first internal clock signal having a duty cycle which is less than a duty cycle of the clock signal; and a second pulse generator that has an input electrically connected to an output of said second differential amplifier and generates a second internal clock signal having a duty cycle which is less than a duty cycle of the clock signal.

10. The device of claim 9, wherein said first pulse generator comprises:

a first PMOS transistor electrically connected in series between a first reference potential and an intermediate output node;

a pair of NMOS transistors electrically connected in series between the intermediate output node and a second reference potential; and a feedback delay circuit having an input electrically connected to the intermediate output node and an output electrically connected to a gate electrode of the first PMOS transistor.

11. The device of claim 10, wherein a first of said pair of NMOS transistors has a gate electrode electrically connected to an output of said first signal generator; and wherein a second of said pair of NMOS transistors has a gate electrode electrically connected to the output of said feedback delay circuit.

12. The device of claim 11, further comprising:

a second PMOS transistor electrically connected in series between the first reference potential and the intermediate output node; and an inverter having an input electrically connected to the intermediate output node and an output electrically connected to a gate electrode of said second PMOS transistor.

* * * * *